(12) United States Patent
Bhatia

(10) Patent No.: US 6,621,300 B1
(45) Date of Patent: Sep. 16, 2003

(54) SYSTEM AND METHOD FOR IMPROVING SPEED OF OPERATION OF INTEGRATED CIRCUITS

(75) Inventor: Ajay Bhatia, Fort Lee, NJ (US)

(73) Assignee: Silicon Graphics, Inc., Mountain View, CA (US)

(*) Notice: Subject to any disclaimer, the term of this patent is extended or adjusted under 35 U.S.C. 154(b) by 0 days.

(21) Appl. No.: 10/131,309

(22) Filed: Apr. 23, 2002

(51) Int. Cl.[7] ........................................ H03K 19/0175
(52) U.S. Cl. ........................................ 326/82; 326/86
(58) Field of Search .................. 326/82–83, 86–87, 326/113–114

(56) References Cited

U.S. PATENT DOCUMENTS

| | | | | |
|---|---|---|---|---|
| 4,541,067 A | * | 9/1985 | Whitaker | 326/27 |
| 5,650,733 A | * | 7/1997 | Covino | 326/24 |
| 5,677,641 A | * | 10/1997 | Nishio et al. | 326/121 |
| 5,898,322 A | * | 4/1999 | Kubota et al. | 326/113 |
| 5,963,067 A | * | 10/1999 | Boucher | 327/112 |
| 6,242,942 B1 | * | 6/2001 | Shamarao | 326/27 |

FOREIGN PATENT DOCUMENTS

| | | | | |
|---|---|---|---|---|
| JP | | 61293018 A | * 12/1986 | ......... H03K/17/693 |

* cited by examiner

Primary Examiner—Michael Tokar
Assistant Examiner—James Cho
(74) Attorney, Agent, or Firm—Baker Botts L.L.P.

(57) ABSTRACT

A system for improving the speed of operation of an integrated circuit incorporating long lines includes a first voltage operable to provide power to the circuit. The system also includes a second voltage that is less than the first voltage and a third voltage that is less than the second voltage. The system also includes a node, wherein a first status is indicated when the voltage at the node is the second voltage and a second status is indicated when the voltage at the node is the third voltage. The system also includes an input of a switching element connected to the node wherein the switching element is operable to switch upon the voltage at the node changing between the second voltage and the third voltage.

18 Claims, 1 Drawing Sheet

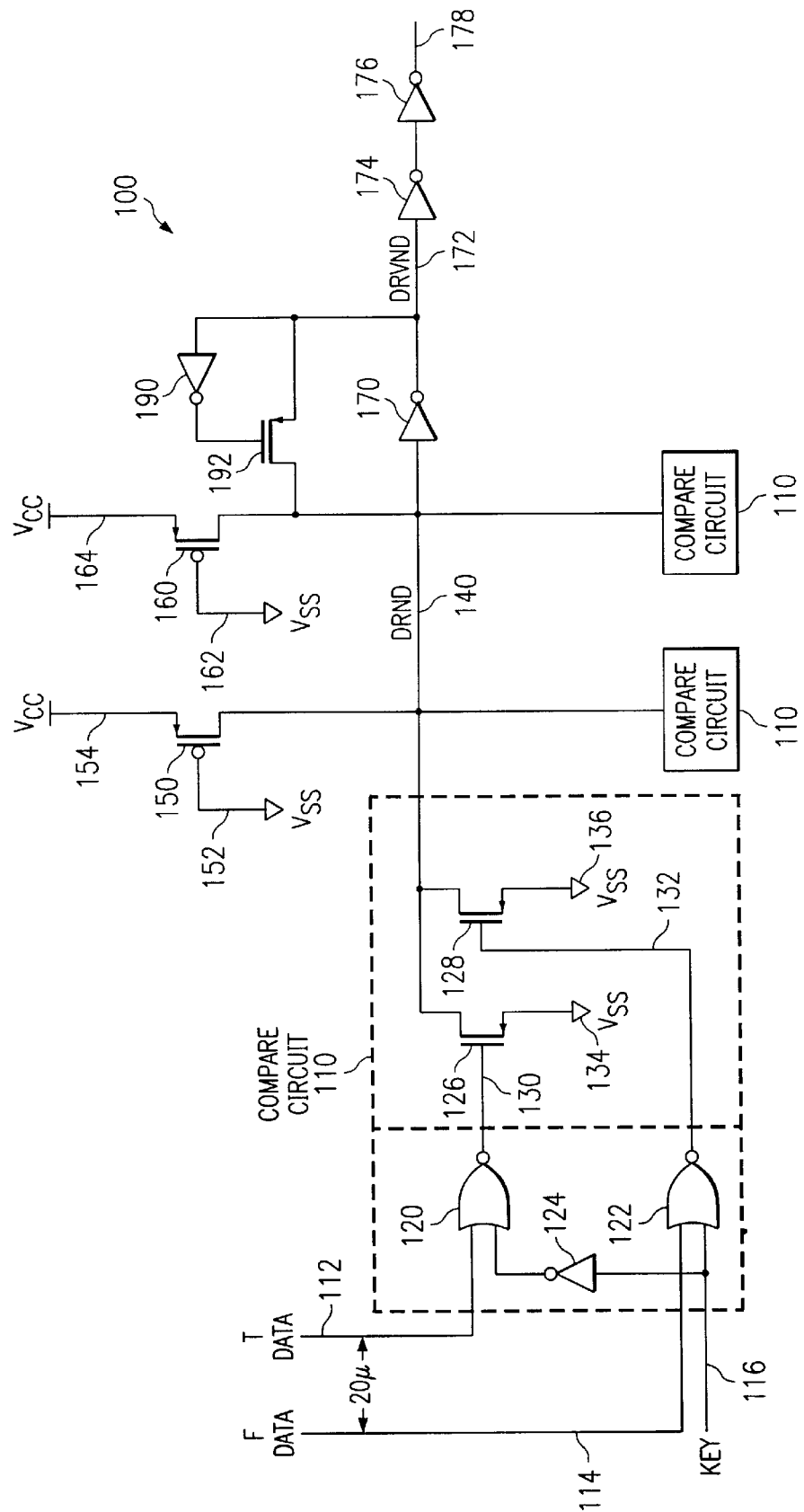

SYSTEM AND METHOD FOR IMPROVING SPEED OF OPERATION OF INTEGRATED CIRCUITS

TECHNICAL FIELD OF THE INVENTION

The present invention relates in general to integrated circuits and more particularly to a system and method for improving the speed of operation of integrated circuits.

BACKGROUND OF THE INVENTION

Traditional integrated circuits may contain relatively long connections between circuit components. These wire connections or "lines" may be subject to Resistance/Capacitance (RC), diffusion, or other electrical effects that result in overall circuit time delays when switching these lines between high and low signal conditions. For example a 22-bit data stream may be spread across a line 1500 microns wide. Such a width, in addition to any gate and diffusion components attached to the line, constitutes a huge load on overall circuit performance and may result in significant delays. These delays slow the operation of circuits, such as a multibit comparator circuit used in Tag Static Random Access Memory (SPAM) to perform a wide logical NOR operation on wide data strings. The time required for a long loaded line to switch "full swing" between a high and low signal condition limits the speed with which other circuit elements that depend on the switching may operate. Therefore, it is desirable to provide a system and method for improving the speed and operation of integrated circuits incorporating long lines.

SUMMARY OF THE INVENTION

From the foregoing, it may be appreciated by those skilled in the art that a need has arisen for a method of driving long lines with signal changes faster than full swing changes. In accordance with the present invention, a system and method for improving the speed of operation of integrated circuits are provided that substantially eliminates or greatly reduces disadvantages and problems associated with conventional methods of driving long lines.

According to an embodiment of the present invention, there is provided a system for improving speed of operation of integrated circuits that includes a first voltage operable to provide power to the circuit. The system also includes a second voltage that is less than the first voltage and a third voltage that is less than the second voltage. The system also includes a node, wherein a first status is indicated when the voltage at the node is the second voltage and a second status is indicated when the voltage at the node is the third voltage. The system also includes an input of a switching element connected to the node and operable to switch upon the voltage at the node changing from the second voltage to the third voltage.

The present invention provides various technical advantages over conventional integrated circuit line driving techniques. For example, one technical advantage is to reduce the delays associated with driving long lines in an integrated circuit. Another technical advantage is to provide an ability to filter undesired electrical signals when processing a data bit stream. Other technical advantages may be readily ascertainable by those skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which:

The FIGURE illustrates a schematic diagram of a comparator circuit system.

DETAILED DESCRIPTION OF THE INVENTION

The FIGURE illustrates a schematic diagram of an electrical circuit according to one embodiment of the present invention. In this particular embodiment, the electrical circuit comprises a comparator circuit 100. Comparator circuit 100 includes at least one compare circuit component a feedback loop 111, a voltage adjuster 113, and an output driver 115 that is operable to receive inputs into comparator circuit 100. Compare circuit is operable to receive an incoming data bit, compare that bit with a known bit, and output the data bit if it is the correct bit or output the known bit if the incoming bit is determined to be incorrect. In one embodiment of the present invention, comparator circuit 100 is operable to process multibit data streams with a plurality of compare circuit components 110.

In one embodiment of the present invention, an incoming data bit, TDATA, is received into compare circuit component 110 at an input 112. The inverse of TDATA, labeled as FDATA, is received into compare circuit component 110 at an input 114. TDATA and FDATA may be may be run in an integrated circuit incorporating comparator circuit 100 perpendicularly from the output of compare circuit component 110 with a spacing of for example 20 microns. A known correct data bit, KEY, is received at an input 116. TDATA 112 is input into a first logical NOR gate 120. KEY 116 is input into a second logical NOR gate 122. NOR gates 120 and 122 may be sized at 4.1 microns, but it is envisioned that other sizes and types of logical gates may be configured by one skilled in the art to give the effect of a NOR gate within the scope of the present invention. FDATA 114 is also input into NOR gate 122. KEY 116 is input into an inverter 124, and the output from inverter 124 is also input into NOR gate 120. Inverter 124 may be an 1.0.5 inverter, but it is envisioned that other sizes of inverter may be implemented within the scope of the present invention.

The output of NOR gate 120 is connected to a gate input 130 of a Negative-channel Metal-Oxide Semiconductor (NMOS) 126. The output of NOR gate 122 is connected to a gate input 132 of a NMOS 128. NMOS 126 and 128 may be sized at 10 microns, but it is envisioned that other sizes of semiconductors may also be implemented within the scope of the present invention. Source inputs 134 and 136 of NMOS 126 and 128 are connected to a sink voltage $V_{ss}$. $V_{ss}$ is the voltage level that comparator circuit 100 regards as a low or binary "zero" signal level. Drain outputs of NMOS 126 and 128 are each connected to a node 140 that is referred to as ORND. For compares of multibit data streams, additional compare circuit components 110 may also output data bits to ORND 140. The operation of compare circuit component 110 will be further considered below.

Comparator circuit 100 also includes a Positive-channel Metal-Oxide Semiconductor (PMOS) 150 as voltage adjuster 113. In one embodiment of the present invention, PMOS 150 is sized as a 2 micron device, but it is envisioned that other sizes of PMOS 150 may be implemented within the scope of the present invention. A gate input 152 of PMOS 150 is connected to sink voltage $V_{SS}$. A source input 154 of PMOS 150 is connected to a source voltage $V_{CC}$. $V_{CC}$ is the voltage level that comparator circuit 100 regards as a high or binary "one" signal level. A drain output of PMOS 150 is connected to ORND 140.

Comparator circuit 100 further includes a PMOS 160 in feedback loop 111. In one embodiment of the present invention, PMOS 160 is sized as a 3 micron device, but it is envisioned that other sizes of PMOS may also be implemented within the scope of the present invention. A gate input 162 of PMOS 160 is connected to sink voltage $V_{SS}$. A source input 164 of PMOS 160 is connected to voltage $V_{CC}$. A drain output of PMOS 160 is connected to ORND 140. ORND 140 is further connected to the input of an inverter 170 of output driver 115. In one embodiment of the present invention, inverter 170 is sized at 5 microns, but it is envisioned that other sizes and styles of inverters may also be implemented within the scope of the present invention. The output of inverter 170 is a node DRVND 172. Output DRVND 172 is connected to an inverter 174, whose output becomes the input to an inverter 176. The output of inverter 176 is a line 178, which communicates the output of comparator circuit 100.

A feedback loop is created by connecting a drain output of a NMOS 192 to ORND 140 and a source input of NMOS 192 to DRVND 172. NMOS 192 may be sized at 12 micron, but it is envisioned that other sizes of NMOS may also be implemented within the scope of the present invention. DRVND 172 is also connected to the input of an inverter 190. The output of inverter 190 is connected to a gate input of NMOS 192. Inverter 190 may be an 1.0.5 inverter, but it is envisioned that other sizes of inverter may be implemented within the scope of the present invention.

The operation of the comparator circuit 100 will now be examined. TDATA 112 is a data bit that is to be compared with KEY 116, a bit that is known to be accurate. When TDATA 112 and KEY 116 match, the gate inputs 130 and 132 of NMOS 120 and 122 will both be at a low voltage condition, meaning neither NMOS 120 nor 122 will be "pulled down" or in the "on" state. In this condition the voltage level at ORND 140 will be less than the source voltage $V_{cc}$. In one embodiment of the present invention, the voltage at ORND 140 during a matched bit condition is approximately $V_{cc}/2+k$, where k is a constant value, the value of which is determined by the size of PMOS 150 and PMOS 160. In one embodiment of the present invention, PMOS 150 is a 2 micron semiconductor with a resulting value for k of approximately 150 millivolts (mV). When ORND 140 is at a voltage of $V_{cc}/2+k$, which is near the midpoint between source voltage $V_{cc}$ and sink voltage $V_{ss}$, the inverter 170 will be effectively shorted, because the voltage at ORND 140 and the voltage at DRVND 172 will be roughly equal. Since there is voltage drop across pass gate NMOS 192 and node ORND is at $V_{cc}/2+k$, node DRVND 172 will be detected as binary level "one" at node 178 by inverter 176 after filtering through inverter 174.

When TDATA 112 and KEY 116 do not match, a data error has occurred and the circuit must respond accordingly. If TDATA 112 incorrectly communicates a low data signal when it should be a high data signal, NMOS 126 will be "pulled down" when it receives a high data signal at gate input 130. Similarly, if TDATA 112 incorrectly communicates a high data signal when it should be a low data signal, NMOS 128 will be "pulled down" when it receives a high data signal at gate input 132. When either NMOS 126 or 128 is "pulled down," the voltage level at ORND 140 will be reduced from approximately $V_{cc}/2+k$ to and the level of $V_{ss}$. The NMOS 134 and 136 are sized so that they are sufficient to pull ORND 140 lower, even though inverter 170 will resist the change in voltage on ORND 140. As the voltage level of ORND 140 is lowered from $V_{cc}/2+k$, the trip level of inverter 170 will be crossed, changing the DRVND 172 output, which changes the output of inverter 190. This releases the gate of NMOS pass gate 192 resulting in active fall of ORND toward $V_{ss}$. The rise of DRVND 172 output 172 results in a changed comparator circuit output 178. Other forms of compare circuit component 110 may be envisioned by one skilled in the art, and any circuit operable to output a high data signal upon the mismatch of an input bit with a check bit is within the scope of the present invention.

The time that elapses between compare circuit component 110 indicating a mismatch and this information appearing at comparator circuit output 178 is an important measurement of circuit delay. Minimizing this delay results in faster and more efficient circuits. In traditional circuit designs a compare circuit output will be at or near a voltage of $V_{cc}$ when indicating that a data bit is correct. When an incorrect data bit is input, the voltage level of the compare circuit output must drop from at or near $V_{cc}$ past a trip level of an inverter toward $V_{ss}$. From $V_{cc}$, it typically requires five gate delay time intervals to pull the output voltage down past the trip level of the inverter. A switch from a voltage of $V_{cc}$ to $V_{ss}$ is known in the art as a "full-swing" switch. In one embodiment of the present invention, ORND 140 is at a voltage level of $V_{cc}/2+k$ when indicating that a data bit is correct. The $V_{cc}/2$ level is provided by the feedback loop. To indicate an incorrect data bit, the level of ORND 140 must be lowered past the trip point of inverter 170 from a beginning voltage of $V_{cc}/2+k$. Thus, less time is required to lower the voltage to the trip level of the inverter 170. ORND 140 is biased at slightly above the trip point of the inverter. Because inverter 170 is biased in the high gain region, only a small voltage swing on ORND 140 is required to pass the trip point of inverter 170. In one embodiment of the present invention, the time required to reach the trip level of inverter 170 is reduced by one or more gate delay time intervals when compared with a "full-swing" switch. A switch from less than $V_{cc}$ to $V_{ss}$ may be referred to as a "low-swing" switch. In a circuit as illustrated in FIG. 1, the time required to reach the trip level of the inverter 170 may be reduced to two gate delay time intervals or less.

Once the incorrect data bit on TDATA 112 has been communicated at output 178, the system must return to a normal correct data bit condition, wherein ORND 140 is returned to a voltage of $V_{cc}/2+k$. Because TDATA 112 and KEY 116 are monitoring signals, the signals are removed after the correct bit information has been communicated at output 178. When the monitoring signals are removed, both NMOS 126 and 128 return to the "mask" or "off" state, and PMOS 150 and 160 are operable to return the voltage level at ORND 140 back to V/2+k. Once the small voltage swing on ORND 140 is detected, and following a loop delay, a pass gate shorting the input and output of inverter 170 releases ORND 140. ORND 140 may now swing back to $V_{cc}/2+k$ to permit faster circuit operation.

An advantage of the present invention is the ability to exclude undesired electrical signals or "noise" from circuit lines. The noise rejection capability is made possible by the existence of a feedback loop comprising node ORND 140, DRVND 172, and NMOS 192. For a noise signal component coupled to the data bit stream on ORND 140 to be passed to output 178, the noise signal must be greater than the loop time constant of the feedback loop. Thus, any noise signals on ORND 140 that are less than the loop time constant of the feedback loop are filtered out of the system and will not be communicated at comparator circuit output 178.

While the present invention has been described as a comparator circuit 100, it is envisioned that the invention may also be beneficial for use in other processor chips and is operable to increase the clock speeds of any electrical circuit where performance is wire-dominated. By way of example, the system and method of the present invention could be embodied in microprocessors such as Test Loop Backs (TLBs), tags, caches, or queues. The present invention is also envisioned as applicable for use in commercial Content Addressable Memories (CAMs), look-up tables, and packet classification engines.

Thus, it is apparent that there has been provided, in accordance with the present invention, a system and method for improving the speed of operation of integrated circuits that satisfy the advantages set forth above. Although the present invention has been described in detail, it should be understood that various changes, substitutions, and alterations may be readily ascertainable by those skilled in the art and may be made herein without departing from the spirit and scope of the present invention as defined by the following claims.

What is claimed is:

1. A system for improving speed of operation of an integrated circuit, comprising:
    a first circuit operable to generate a first output in response to a first condition;
    a voltage adjuster operable to continuously connect a source voltage to the first output in response to a sink voltage;
    a feedback loop operable to place the first output at a first level, the first level being less than the source voltage, the voltage adjuster operable to adjust the first level of the first output.

2. The system of claim 1, wherein the first circuit is operable to generate a second output in response to a second condition, the second output being at the sink voltage.

3. The system of claim 2, wherein the second condition pulls down the first level of the first output to the sink voltage of the second output.

4. The system of claim 2, wherein the first circuit is a compare circuit.

5. The system of claim 4, wherein the compare circuit provides the first output upon a match between two inputs, the compare circuit providing the second output when the two inputs do not match.

6. The system of claim 1, wherein the first level is half the source voltage plus an amount provided by the voltage adjuster.

7. The system of claim 6, wherein the amount provided by the voltage adjuster is determined by a size of the voltage adjuster.

8. The system of claim 7, wherein the amount is 150 mV based on the size of the voltage adjuster being 2 microns.

9. A system for improving speed of operation of an integrated circuit, comprising:
    a first circuit operable to generate a first output in response to a first condition;
    a voltage adjuster coupled to a source voltage and a sink voltage;
    a feedback loop operable to place the first output at a first level, the first level being less than the source voltage, the voltage adjuster operable to adjust the first level of the first output, wherein the feedback loop filters out noise from the first circuit.

10. The system of claim 9, wherein the noise filtered out is below a loop time constant of the feedback loop.

11. A method for improving speed of operation of an integrated circuit comprising:
    receiving a source voltage;
    receiving a sink voltage;
    providing a voltage adjustment in a signal line in response to the source and sink voltages,
    generating a first output on the signal line in response to a first event;
    generating a second output on the signal line in response to a second event, the second output being the sink voltage;
    setting the first output to half of the source voltage plus the voltage adjustment; and
    wherein the second event causes the first output to be pulled down to the sink voltage of the second output;
    eliminating noise on the signal line from the first output and the second output without affecting an operating speed of the integrated circuit.

12. The method of claim 11, further comprising:
    receiving a first input;
    receiving a second input; and
    comparing the first input to the second input, wherein the first event occurs when the first input matches the second input and the second event occurs when the first input does not match the second input.

13. The method of claim 11, further comprising:
    returning the signal line to the first output upon detection of the first event.

14. The method of claim 13, wherein the first output is set to a level just above a desired trip point.

15. A system for improving speed of operation of an integrated circuit comprising:
    means for receiving a source voltage;
    means for receiving a sink voltage;
    means for providing a voltage adjustment in a signal line in response to the source and sink voltages,
    means for generating a first output on the signal line in response to a first event;
    means for generating a second output on the signal line in response to a second event, the second output being the sink voltage;
    means for setting the first output to half of the source voltage plus the voltage adjustment; and
    wherein the second event causes the first output to be pulled down to the sink voltage of the second output;
    means for eliminating noise on the signal line from the first output and the second output without affecting an operating speed of the integrated circuit.

16. The system of claim 15, further comprising:
    means for receiving a first input;
    means for receiving a second input; and
    means for comparing the first input to the second input, wherein the first event occurs when the first input matches the second input and the second event occurs when the first input does not match the second input.

17. The system of claim 15, further comprising:
    means for returning the signal line to the first output upon detection of the first event.

18. The system of claim 17, wherein the first output is set to a level just above a desired trip point.

* * * * *